United States Patent
Wu et al.

(10) Patent No.: US 7,052,949 B2
(45) Date of Patent: May 30, 2006

(54) METHOD FOR FORMING BIT LINE

(75) Inventors: Kuo-Chien Wu, Miaoli (TW); Tse-Yao Huang, Taipei (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/459,327

(22) Filed: Jun. 11, 2003

(65) Prior Publication Data

US 2004/0127013 A1    Jul. 1, 2004

(30) Foreign Application Priority Data

Dec. 31, 2002    (TW) ............................... 91138102 A

(51) Int. Cl.
*H01L 21/4763*    (2006.01)
*H01L 21/8238*    (2006.01)

(52) U.S. Cl. ...................... 438/233; 438/618; 438/672

(58) Field of Classification Search ............... 438/197, 438/199, 233, 618, 653, 669, 672
See application file for complete search history.

(56) References Cited

U.S. PATENT DOCUMENTS

| 5,817,572 | A | * | 10/1998 | Chiang et al. | 438/624 |
| 5,956,594 | A | * | 9/1999 | Yang et al. | 438/396 |
| 6,093,628 | A | * | 7/2000 | Lim et al. | 438/592 |
| 6,100,135 | A | * | 8/2000 | Wu | 438/253 |
| 6,133,083 | A | * | 10/2000 | Lin et al. | 438/238 |
| 6,342,416 | B1 | * | 1/2002 | Kim et al. | 438/239 |
| 6,525,357 | B1 | * | 2/2003 | Amano et al. | 257/295 |
| 6,611,449 | B1 | * | 8/2003 | Hilliger | 365/145 |
| 2002/0076895 | A1 | * | 6/2002 | Chien et al. | 438/398 |

* cited by examiner

*Primary Examiner*—Zandra V. Smith
*Assistant Examiner*—Pamela E Perkins
(74) *Attorney, Agent, or Firm*—Quintero Law Office

(57) ABSTRACT

A method for forming a bit line. A semiconductor substrate is provided. A MOS having a gate and an S/D area is formed on the semiconductor substrate. A first dielectric layer with a first opening is formed on the semiconductor substrate to expose the S/D area. A conducting layer is formed in the first opening. A barrier layer is formed on the surface of the first dielectric layer and the conducting layer. A second dielectric layer having a second opening and a third opening is formed on the barrier layer, the position of the second opening corresponding to the first opening. Metal layers are formed in the second opening and the third opening as bit lines, respectively.

8 Claims, 12 Drawing Sheets

METHOD FOR FORMING BIT LINE

BACKGROUND OF THE INVENTION

1. Field of the Invention

The present invention relates to a method for forming a bit line, more particularly, it relates to a method for controlling the depth of the bit line and the bit line contact.

2. Description of the Related Art

FIGS. 1a to 1f are AA line cross-sections of FIG. 3 of a conventional method for forming a bit line.

In FIG. 1a, a semiconductor substrate 101 is provided. A gate oxide layer 103, a poly silicon layer 104, a nitride layer 105, and a patterned photoresist layer 106 for forming a gate are sequentially formed on the semiconductor substrate 101.

In FIG. 1b, the nitride layer 105, the poly silicon layer 104, and the gate oxide layer 103 are sequentially anisotropically etched using the photoresist layer 106 as a mask to form a nitride layer 105a, a poly silicon layer 104a, and a gate oxide layer 103a respectively. The patterned photoresist layer 106 is removed. A gate is formed by the poly silicon layer 104a and the nitride layer 105a.

In FIG. 1c, a nitride layer is conformally formed on the surface of the semiconductor substrate 101 and the elements thereon. The nitride layer is anisotropically etched to form a spacer 107 on a sidewall of the gate.

In FIG. 1d, an oxide layer 108 and a patterned photoresist layer 109 with an opening 110 are sequentially formed on the semiconductor substrate 101. A portion of the oxide layer 108 is exposed by the opening 110.

In FIG. 1e, the oxide layer 108 is anisotropically etched using the patterned photoresist layer 109 as an etching mask to form an opening as a bit line contact. The patterned photoresist layer 109 is removed.

In FIG. 1f, a poly silicon layer 111 is formed on the oxide layer 108, and the opening is filled with the poly silicon layer 111. The poly silicon layer 111 is planarized until the surface of the oxide layer 108 is exposed. The poly silicon layer 111a in the opening is at a predetermined distance of about 300 to 3000 Å form the top of the opening. An opening 111b is formed in layer 111a.

FIGS. 1g to 1j are BB line cross-sections of FIG. 3 of a conventional method for forming a bit line.

In FIG. 1g, a patterned photoresist layer 112 with an opening 113 is formed on the surface of the oxide layer 108, corresponding to the peripheral circuit layer 102.

In FIG. 1h, the oxide layer 108 is anisotropically etched to form an opening 114 using the patterned photoresist layer 112 as a mask. The patterned photoresist layer is removed.

In FIG. 1i, a patterned photoresist layer 115 with openings 116a and 116b is formed on the oxide layer 108.

The oxide layer 108 is anisotropically etched to form an opening with a predetermined depth using the patterned photoresist layer 115 as a mask, and then an ultra thin barrier layer 117 is formed on the surface of the openings 111b, 116, and 114. A tungsten metal layer is formed on the surface of the oxide layer 108, and the openings 111b, 116, and 114 are filled with the tungsten metal layer. The tungsten metal layer is etched back to expose the surface of the oxide layer 108, such that a tungsten metal layer 118a, 118b, and 118c are formed in the opening 111b, 116, and 114 respectively. The tungsten metal layer 118a and 118b are bit lines, and the tungsten metal layer 118c is a contact of the peripheral circuit wire.

The transmission rate is high due to tungsten's low resistance. When tungsten layers 118a, 118b, and 118c are doped with $WF_6$ gas, gaps are created in the poly silicon layer by F ions in the $WF_6$ gas entering thereinto.

SUMMARY OF THE INVENTION

An object of the invention is to provide a method for forming a bit line with an additional barrier layer to control the depth of the bit line and the bit line contact.

Accordingly, the present invention provides a method for forming a bit line. A semiconductor substrate is provided. A MOS having a gate and an S/D area is formed on the semiconductor substrate. A first dielectric layer with a first opening is formed on the semiconductor substrate to expose the S/D area. A conducting layer is formed in the first opening. A barrier layer is formed on the first dielectric layer and the conducting layer. A second dielectric layer is formed on the barrier layer. The second dielectric layer is patterned to form a first bit line trench and a second bit line trench on the barrier layer using the barrier layer as a stop layer, wherein the first bit line trench corresponds to the contact plug and the second bit line trench does not correspond to the contact plug. Bit lines are formed in the first bit line trench and the second bit line trench, wherein the depth of the bit lines are controlled by the barrier layer.

Accordingly, the present invention also provides another method for forming a bit line. A semiconductor substrate having a peripheral circuit layer is provided, wherein a MOS having a gate and an S/D area is formed on the semiconductor substrate. A first dielectric layer with a first opening is formed on the semiconductor substrate to expose the S/D area, wherein the first opening is formed as a bit line contact. A conducting layer is formed in the first opening. A first barrier layer is formed on the surface of the first dielectric layer and the conducting layer. A second dielectric layer is formed on the first barrier layer. The second dielectric layer is patterned to form a first bit line trench and a second bit line trench on the first barrier layer using the first barrier layer as an etching stop, the first bit line trench corresponding to the first contact opening and the second bit line trench does not correspond to the first contact opening. A patterned photoresist layer is formed with a first opening corresponding to the first bit line trench, a second opening corresponding to the second bit line trench and a third opening on the second dielectric layer the position of the third opening corresponding to the peripheral circuit layer. The second dielectric layer, the first barrier layer, and the first dielectric layer are sequentially etched to form a second contact opening, wherein the second contact opening exposes the surface of the peripheral circuit layer, and the barrier layer in the first bit line trench and the second bit line trench is removed. A second barrier layer is conformally formed on the surface of the first bit line trench, the second bit line trench and the second contact opening. A metal layer is formed in the first bit line trench and the second bit line trench as bit lines, the metal layer fillina the second contact opening as a second contact plug.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
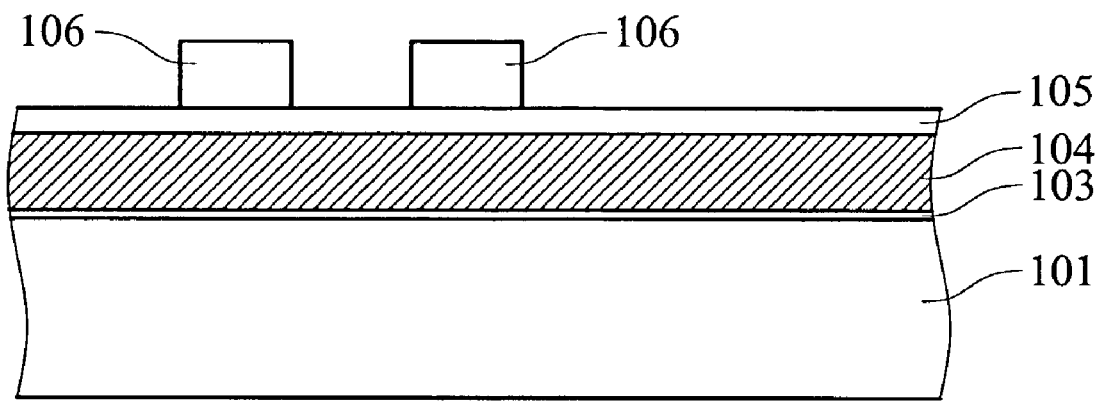
FIGS. 1a to 1f are AA line cross-sections of FIG. 3 of a conventional method for forming a bit line.
Figure 1B:
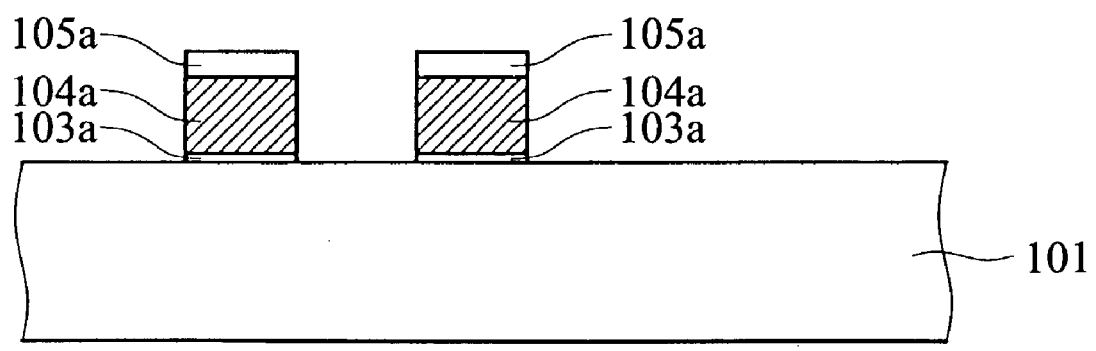
Figure 1C:
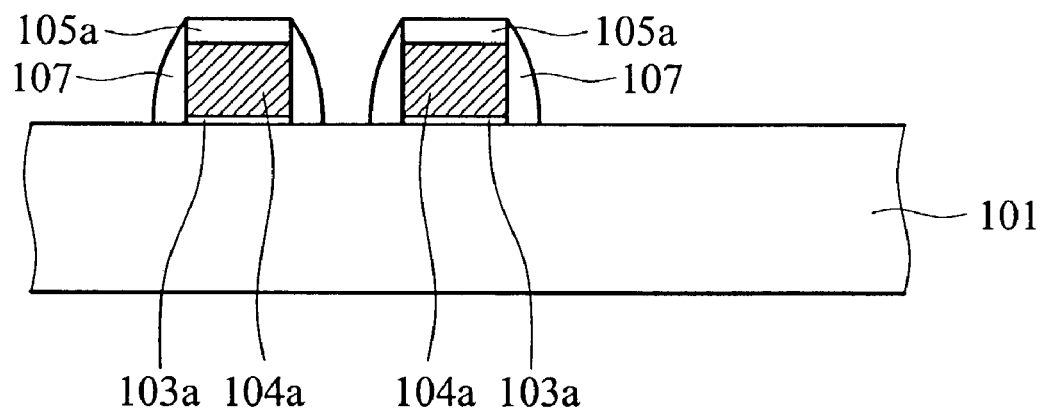
Figure 1D:
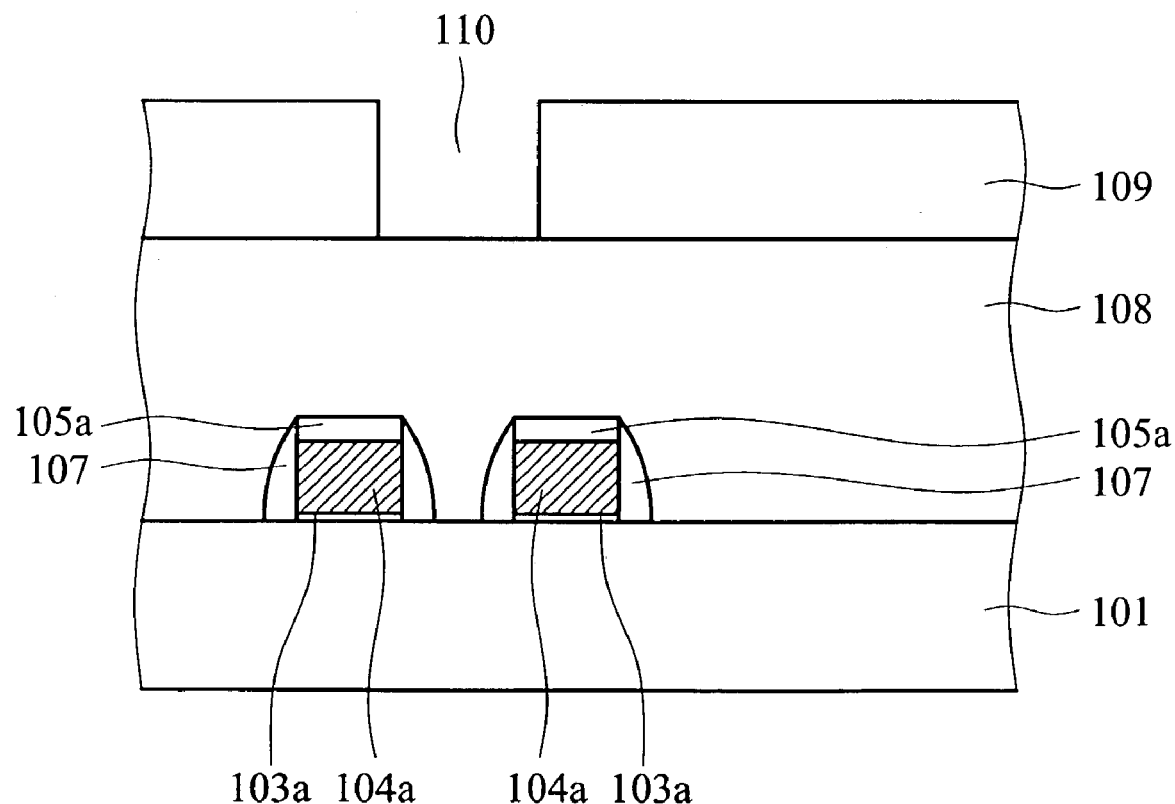
Figure 1E:
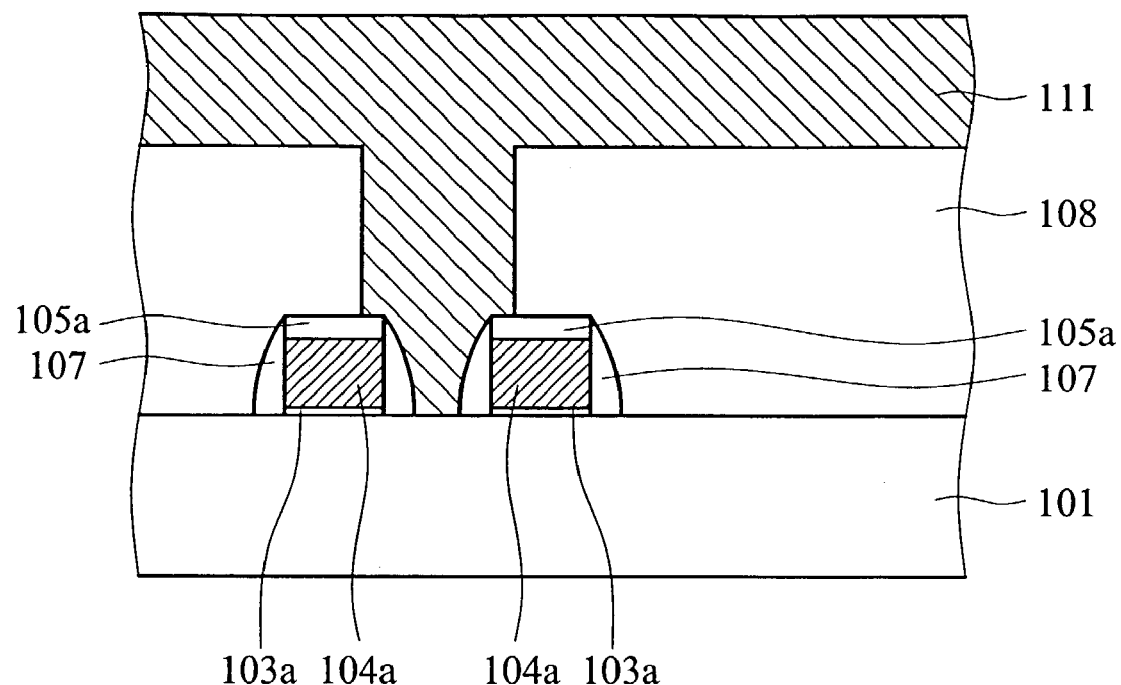
Figure 1F:
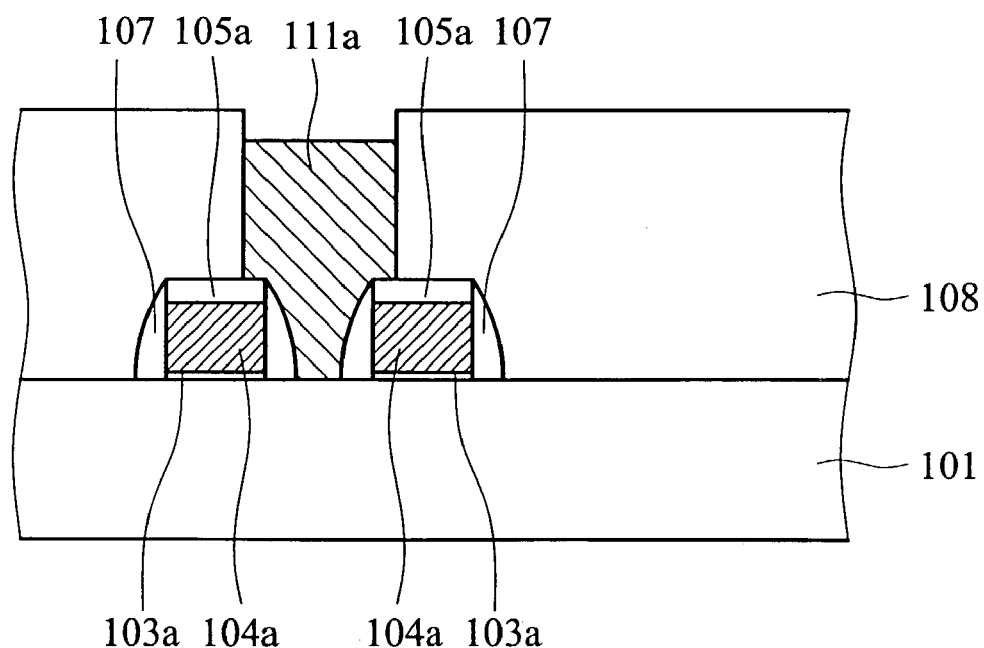
Figure 1G:
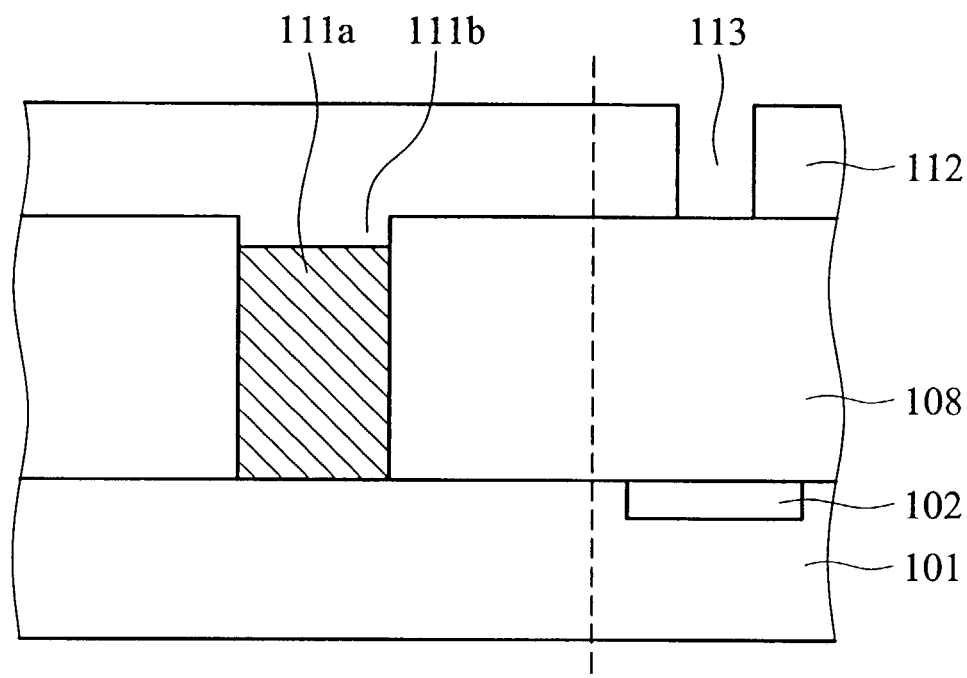
FIGS. 1g to 1j are BB line cross-sections of FIG. 3 of a conventional method for forming a bit line.
Figure 1H:
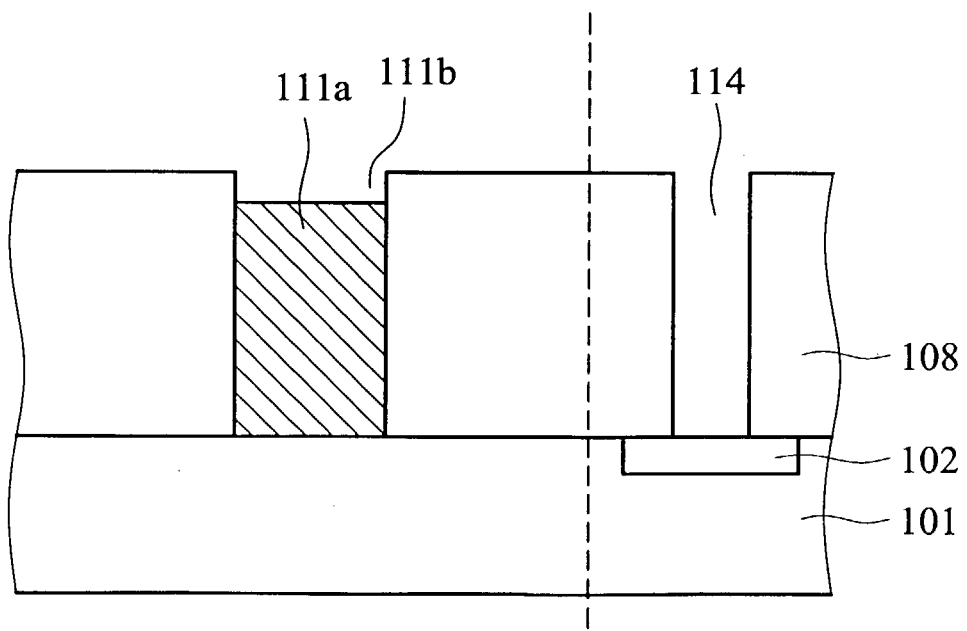
Figure 1I:
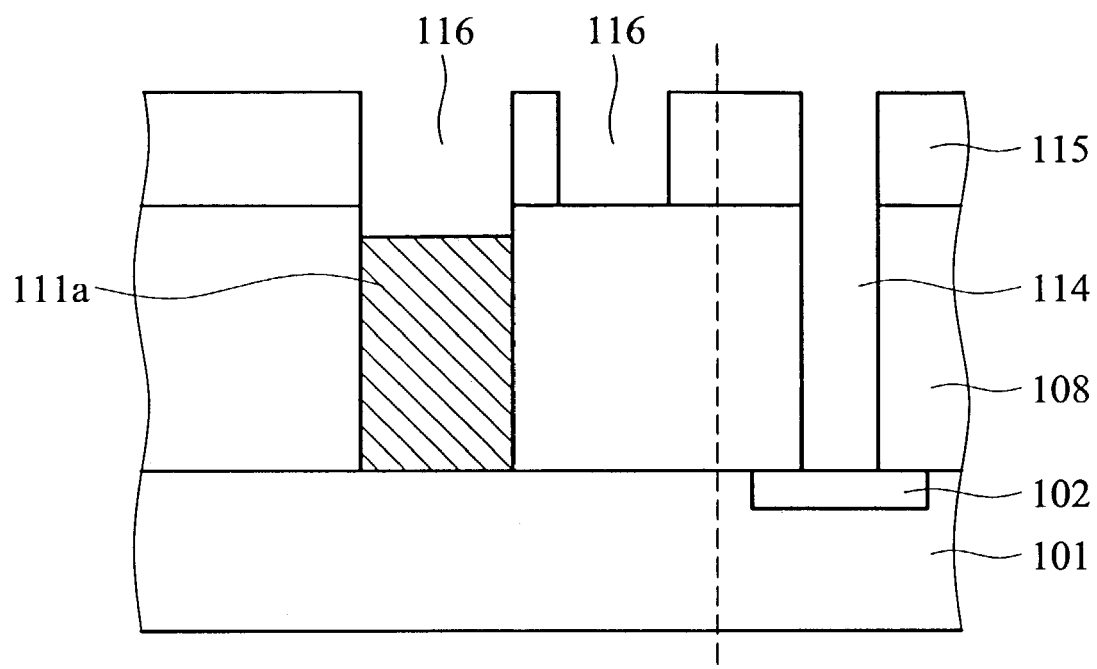
Figure 1J:
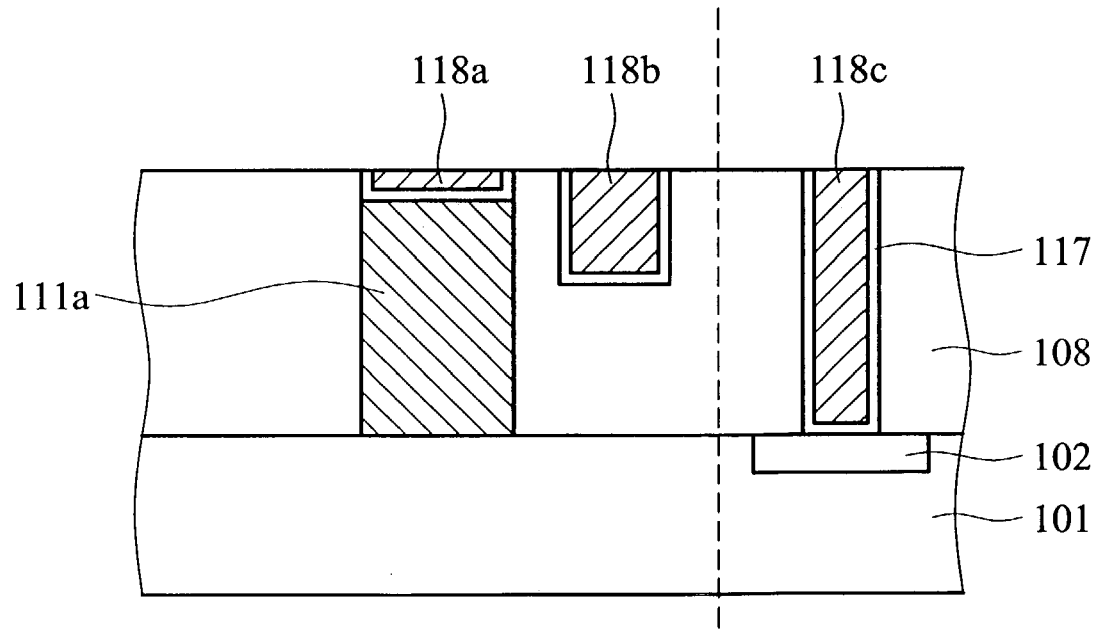
Figure 2A:
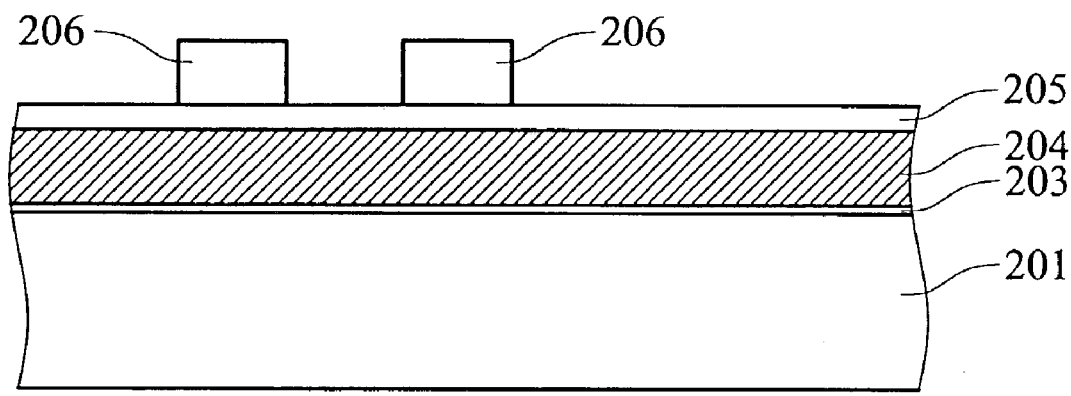
FIGS. 2a to 2g are AA line cross-sections of FIG. 3 of a method for forming a bit line of the present invention.
Figure 2B:
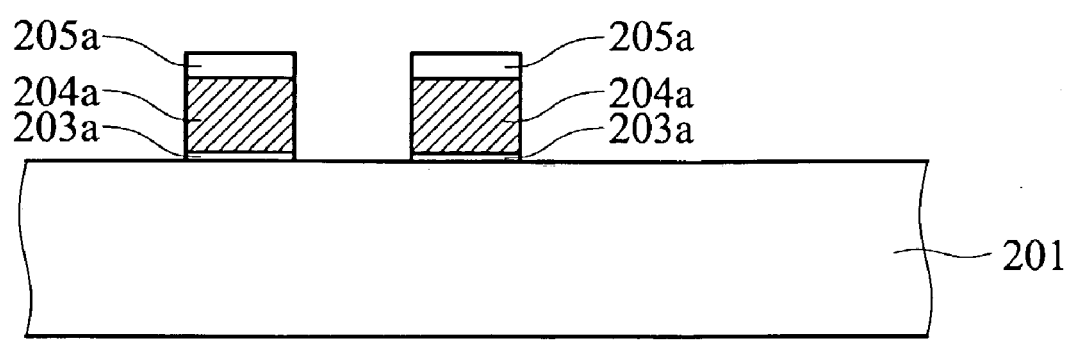
Figure 2C:
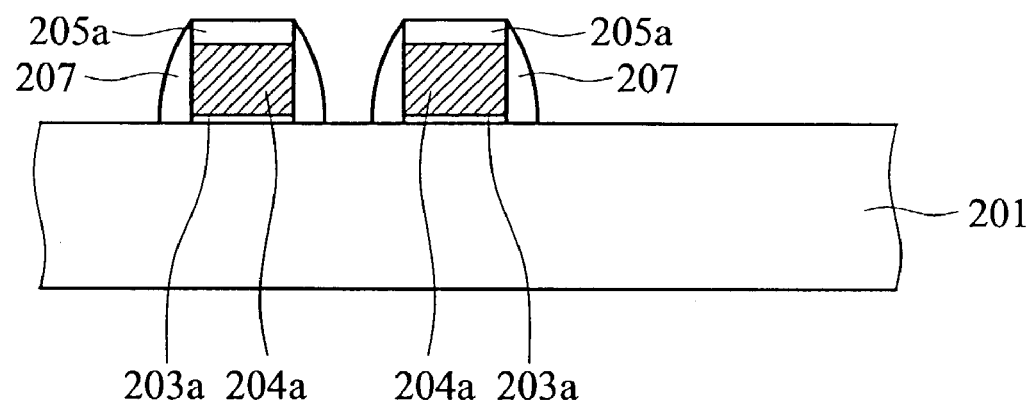
Figure 2D:
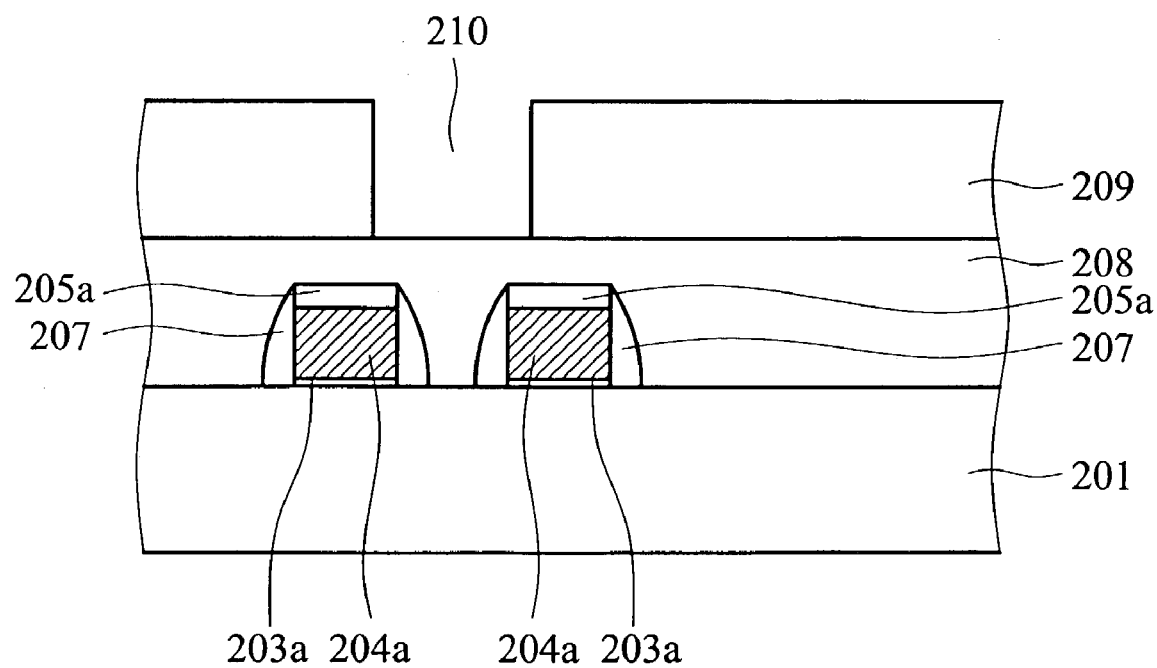
Figure 2E:
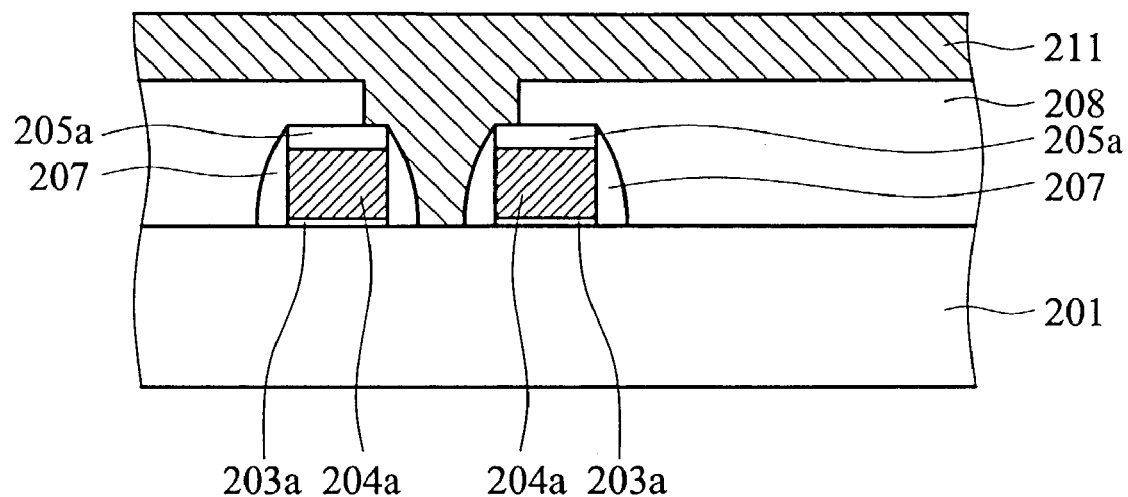
Figure 2F:
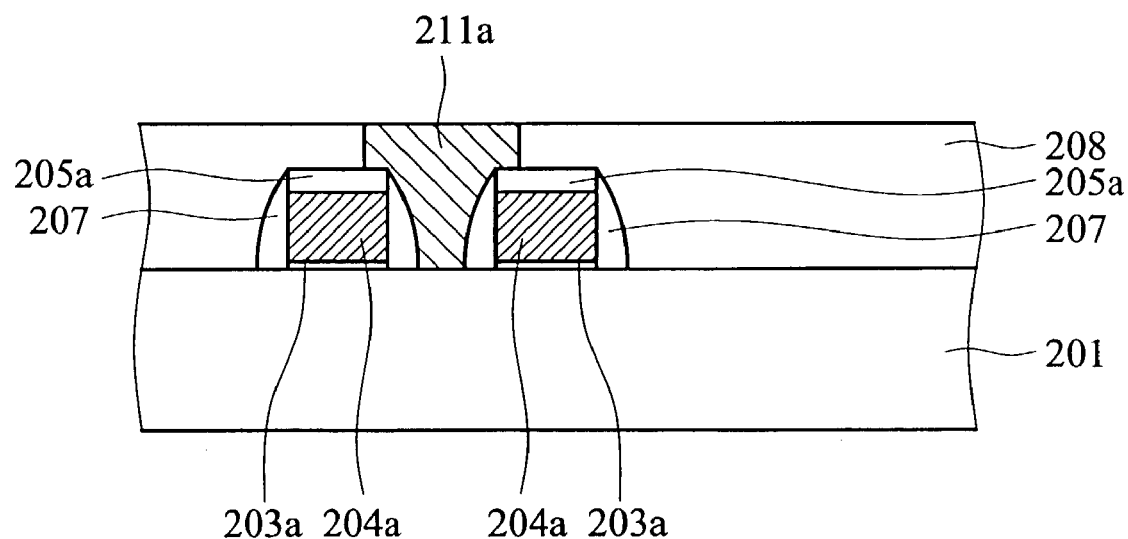
Figure 2G:
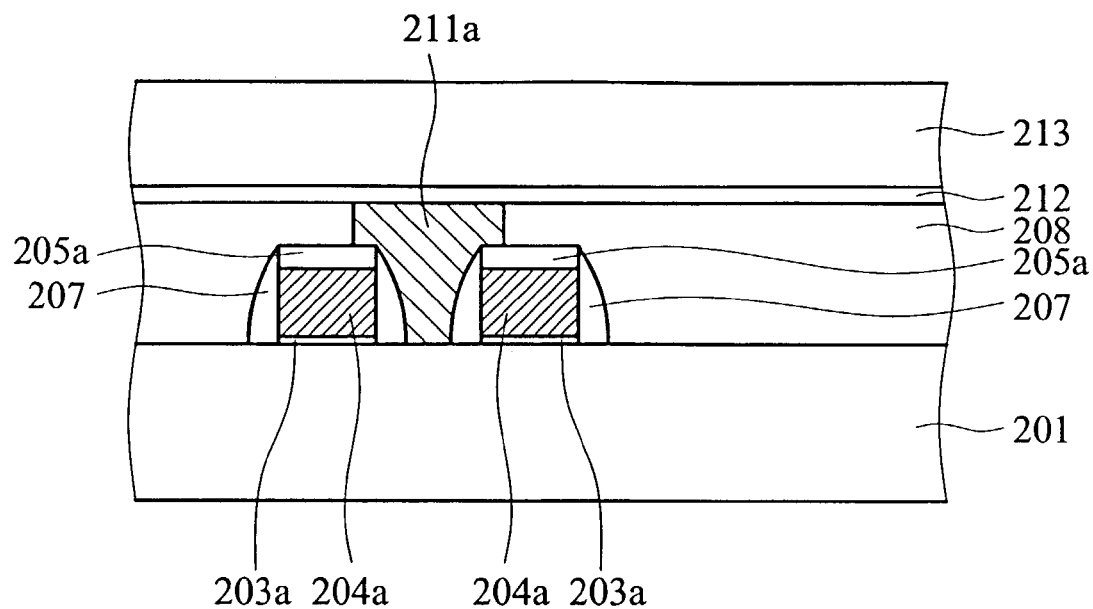
Figure 3:
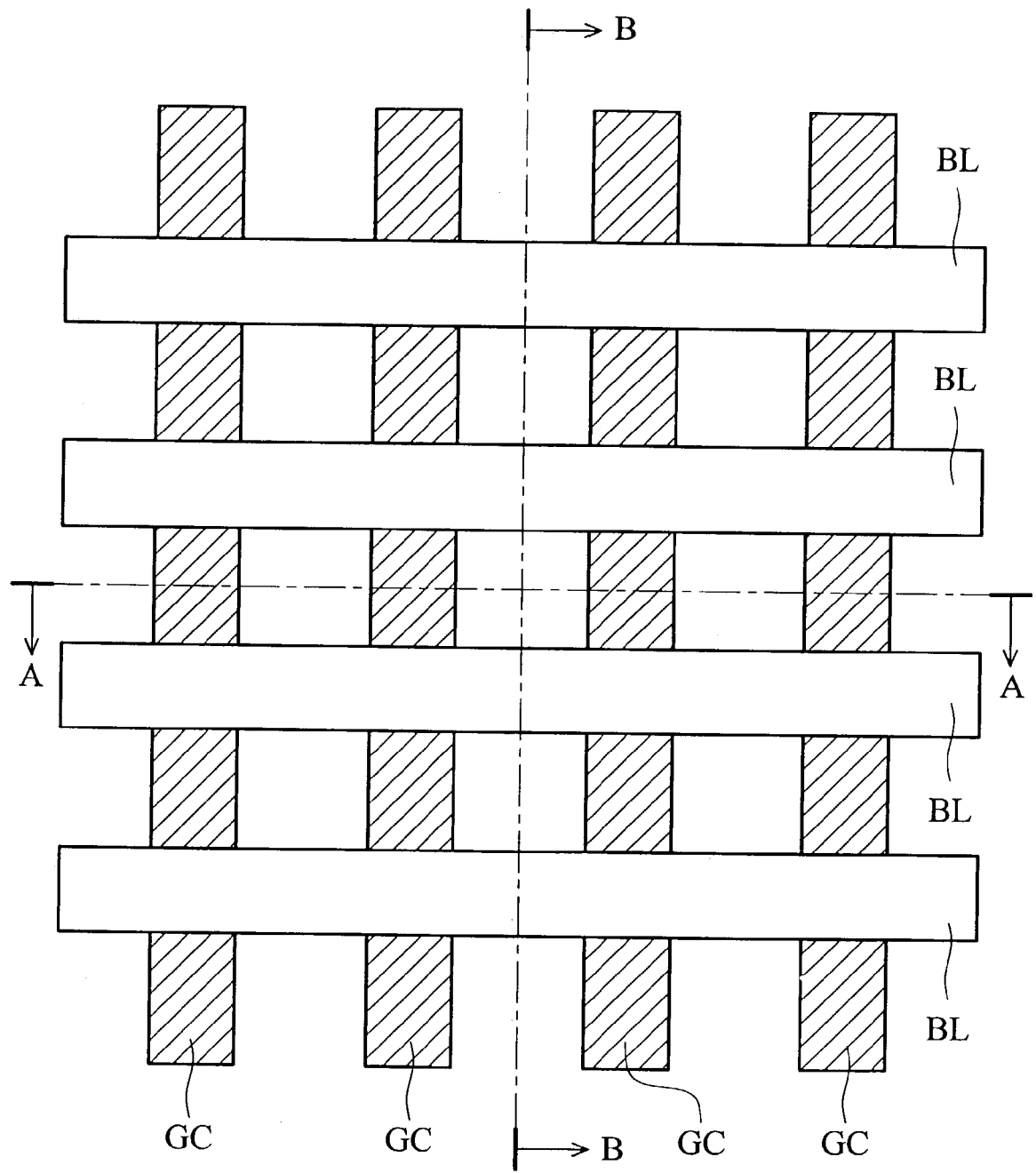
FIG. 3 is a top view of a memory array.

FIGS. 2a to 2g are AA line cross-sections of FIG. 3 of a method for forming a bit line of the present invention.

In FIG. 2a, a semiconductor substrate 201, such as poly silicon layer, is provided. A gate dielectric layer 203, such as gate oxide layer, a conducting layer 204, such as poly silicon layer or epi-silicon layer, a hard mask layer 205, such as nitride later, and a patterned photoresist layer 206 are sequentially formed on the semiconductor substrate 201.

In FIG. 2b, the hard mask layer 205, the conducting layer 204, and the gate dielectric layer 203 are sequentially anisotropically etched using the patterned photoresist layer 206 as a mask to form a hard mask layer 205a, a conducting layer 204a, and a gate dielectric layer 203a respectively. A gate is formed by the conducting layer 204a and the hard mask layer 205a, and the patterned photoresist layer 206 is removed. The anisotropic etching can be reactive ion etching or plasma etching.

In FIG. 2c, an insulating layer, such as nitride layer, is conformally formed on the surface of the semiconductor substrate 201 and the elements thereon. The insulating layer is anisotropically etched to form a spacer 207 on the sidewall of the gate. The anisotropic etching can be reactive ion etching or plasma etching.

In FIG. 2d, a dielectric layer 208, such as oxide layer, and a patterned photoresist layer 209 with an opening 210 are sequentially formed on the semiconductor substrate 201, such that the opening 210 exposes a portion of the dielectric layer 208. More particularly, the dielectric layer 208 can be a tetra ethyl ortho silicate oxide (TEOS) layer.

In FIG. 2e, the dielectric layer 208 is anisotropically etched to form an opening using the patterned photoresist layer 209 as an etching mask. The patterned photoresist layer 209 is removed. The anisotropic etching is reactive ion etching or plasma etching.

In FIG. 2f, a conducting layer 211, such as poly silicon layer or epi-silicon layer, is formed on the dielectric layer 208, and the opening in the dielectric layer 208 is filled with the conducting layer 211. The conducting layer 211 is planarized by chemical mechanically polishing (CMP) until the surface of the dielectric layer 208 is exposed to form a conducting layer 211a in the opening. The leakage of the bit line formed by poly silicon or epi-silicon is lower.

In FIG. 2g, a barrier layer 212, such as a nitride layer, and a dielectric layer 213, such as a TEOS oxide layer, are sequentially formed on the surface of the dielectric layer 208 and the conducting layer 211a. The thickness of the barrier layer 212, acting as a stop layer, is about 200 to 2000 Å.

FIGS. 2h to 2l are BB line cross-sections of FIG. 3 of the method for forming a bit line of the present invention.

Figure 2H:
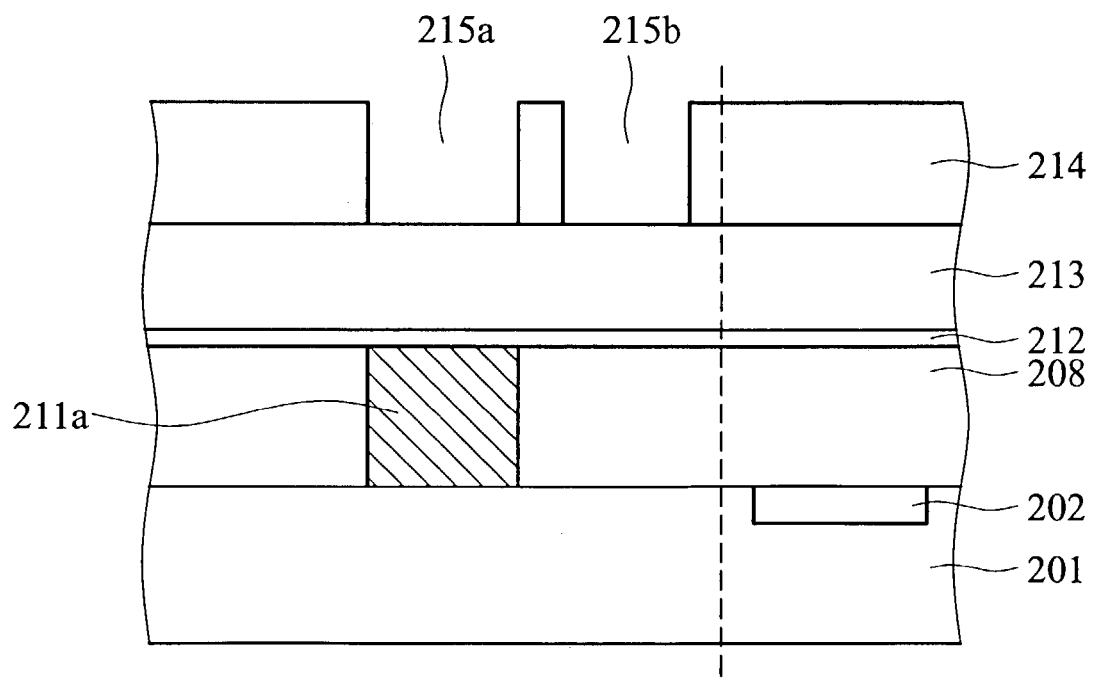
FIGS. 2h to 2l are BB line cross-sections of FIG. 3 of a method for forming a bit line of the present invention.

In FIG. 2h, a patterned photoresist layer 214 with openings 215a and 215b is formed on the dielectric layer 213, the opening 215a corresponding to the conducting layer 211a. A peripheral circuit layer 202, such as doping ion area, is shown in the BB line cross-section.

Figure 2I:
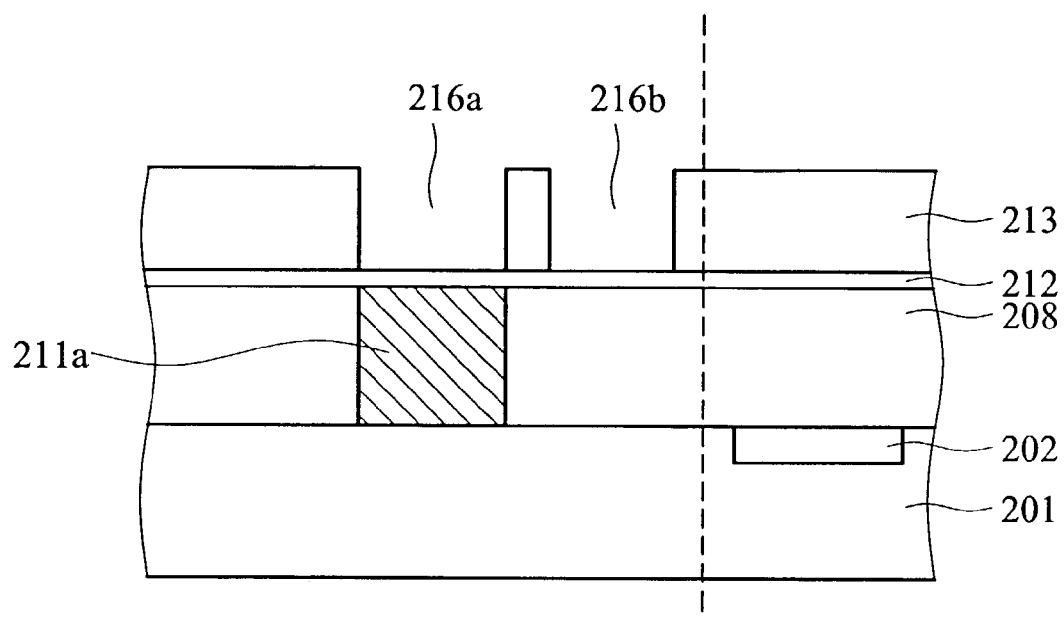

In FIG. 2i, the dielectric layer 213 is anisotropically etched to expose the surface of the barrier layer 212 using the patterned photoresist layer 214 as a mask to form openings 216a and 216b. The patterned photoresist layer 214 is removed.

Figure 2J:
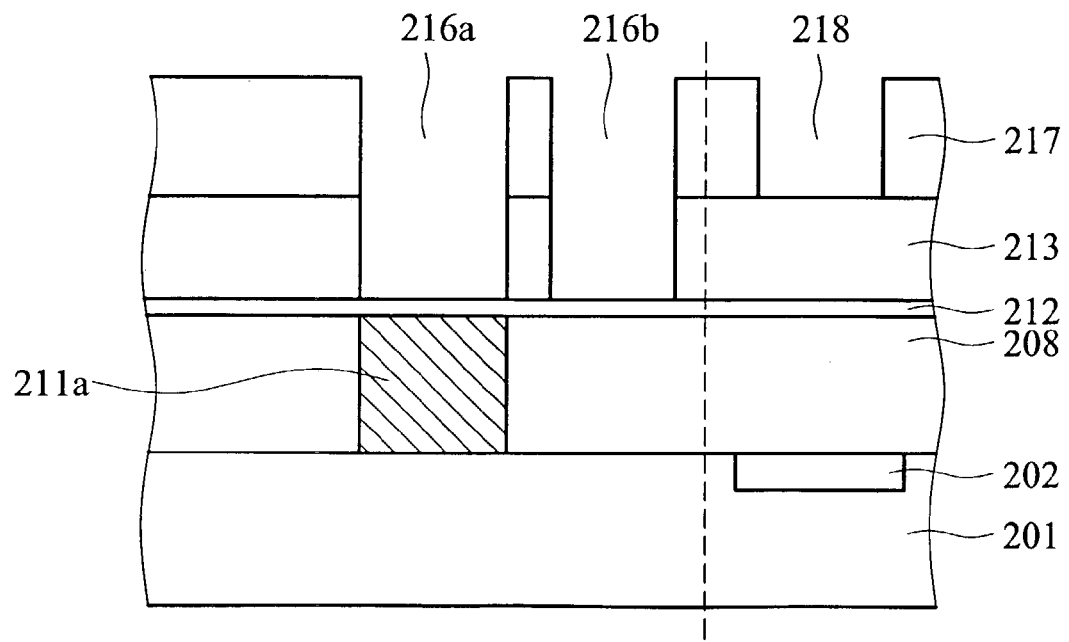

In FIG. 2j, a patterned photoresist layer 217 with an opening 218 is formed on the dielectric layer 213, the opening 218 corresponding to the peripheral circuit layer 202.

Figure 2K:
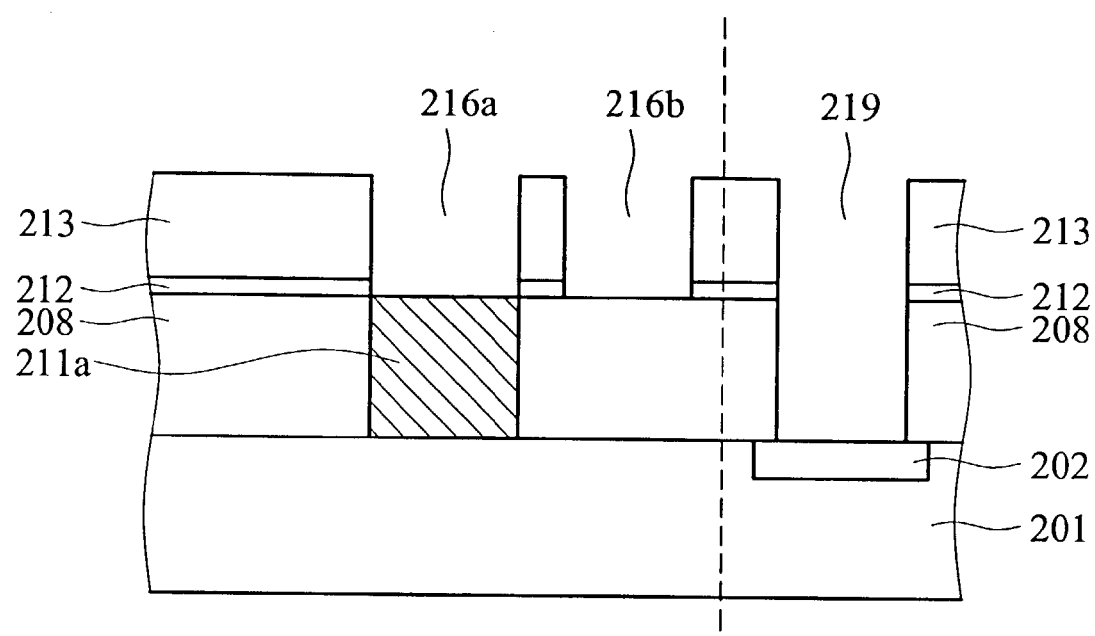

In FIG. 2k, the exposed dielectric layer 213, barrier layer 212, and dielectric layer 208 are sequentially anisotropically etched until the peripheral circuit layer 202 is exposed to form an opening 219. The patterned photoresist layer 217 is removed.

Figure 2L:
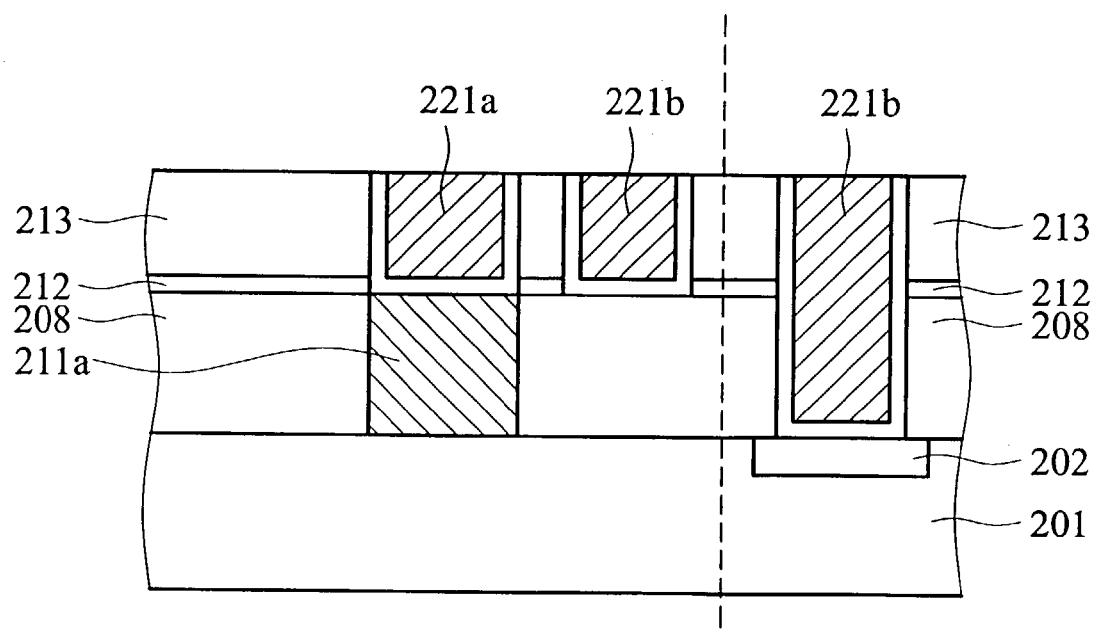

In FIG. 2l, an ultra thin barrier layer is conformally formed on the surface of the dielectric layer 212, and the openings 216a, 216b, and 219 by chemical vapor deposition (CVD). A metal layer, such as tungsten layer, is formed on the surface of the dielectric layer 212, and the openings 216a, 216b, and 219 are filled with the metal layer. The metal layer is planarizd until the surface of the dielectric layer 212 is exposed to leave a metal layer 221a and 221b as bit line and a peripheral circuit layer contact in openings 216a, 216b, and 219 respectively. A barrier layer 220, such as TiN layer, is formed thereon.

The present invention provides an additional barrier layer 212 as an etching stop layer to control the depth of the bit line and the bit line contact. The bit line and the bit line contact provide high quality without leakage. The size of the bit line is reduced, and shorts between the bit lines are avoided.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a bit line, comprising:
   providing a semiconductor substrate having a peripheral circuit layer, wherein a MOS having a gate and an S/D area is formed on the semiconductor substrate;
   forming a first dielectric layer with a first contact opening on the semiconductor substrate, wherein the first contact opening exposes the S/D area;
   forming a first contact plug in the first contact opening;

forming a first barrier layer on the surface of the first dielectric layer and the first contact plug;

forming a second dielectric layer on the first barrier layer;

patterning the second dielectric layer to form a first bit line trench and a second bit line trench on the first barrier layer using the first barrier layer as an etching stop, the first bit line trench corresponding to the first contact opening and the second bit line trench does not correspond to the first contact opening;

forming a patterned photoresist layer with a first corresponding to the first bit line trench, a second opening corresponding to the second bit line trench and a third opening corresponding to the second dielectric layer, the position of the third opening corresponding to the peripheral circuit layer;

sequentially etching the second dielectric layer, the first barrier layer, and the first dielectric layer to form a second contact opening, wherein the second contact opening exposes the surface of the peripheral circuit layer, and the barrier layer in the first bit line trench and second bit line trench is removed;

conformally forming a second barrier layer on the surface of the first bit line trench, the second bit line trench and the second contact opening; and filling a metal layer in the first bit line trench and the second bit line trench as bit lines, the metal layer filling the second contact opening as a second contact plug.

2. The method for forming a bit line as claimed in claim 1, wherein the peripheral circuit layer is an ion doping area.

3. The method for forming a bit line as claimed in claim 1, wherein the first dielectric layer is an oxide layer.

4. The method for forming a bit line as claimed in claim 1, wherein the first contact plug comprises poly silicon or epi-silicon.

5. The method for forming a bit line as claimed in claim 1, wherein the first barrier layer is a nitride layer.

6. The method for forming a bit line as claimed in claim 1, wherein the second dielectric layer is a tetra ethyl ortho silicate oxide layer.

7. The method for forming a bit line as claimed in claim 1, wherein the second barrier layer is a TiN/Ti layer.

8. The method for forming a bit line as claimed in claim 1, wherein the metal layer is a tungsten layer.

* * * * *